US009170500B2

(12) United States Patent
Van Schoot et al.

(10) Patent No.: US 9,170,500 B2
(45) Date of Patent: Oct. 27, 2015

(54) LITHOGRAPHIC APPARATUS AND DEVICE MANUFACTURING METHOD WITH CORRECTIVE POSITIONING OF REFLECTIVE ELEMENT

(75) Inventors: Jan Bernard Plechelmus Van Schoot, Eindhoven (NL); Koen Van Ingen Schenau, Veldhoven (NL); Gosse Charles De Vries, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 525 days.

(21) Appl. No.: 13/510,518

(22) PCT Filed: Sep. 8, 2010

(86) PCT No.: PCT/EP2010/063192
§ 371 (c)(1),
(2), (4) Date: May 17, 2012

(87) PCT Pub. No.: WO2011/060975
PCT Pub. Date: May 26, 2011

(65) Prior Publication Data
US 2012/0229787 A1    Sep. 13, 2012

Related U.S. Application Data

(60) Provisional application No. 61/262,225, filed on Nov. 18, 2009.

(51) Int. Cl.
*G03F 7/20* (2006.01)
*G02B 26/08* (2006.01)
*G02B 27/00* (2006.01)

(52) U.S. Cl.
CPC ........ *G03F 7/70425* (2013.01); *G02B 26/0833* (2013.01); *G02B 27/0068* (2013.01); *G03F 7/70075* (2013.01); *G03F 7/70116* (2013.01); *G03F 7/70191* (2013.01)

(58) Field of Classification Search
CPC ............ G02B 26/0833; G02B 27/0068; G03F 7/70075; G03F 7/70116; G03F 7/70191; G03F 7/70425
USPC ................. 355/67, 77; 359/196.1, 216.1, 850
See application file for complete search history.

(56) References Cited

U.S. PATENT DOCUMENTS

2003/0038225 A1    2/2003    Mulder et al.
2005/0231651 A1*  10/2005    Myers et al. .................. 348/744
(Continued)

FOREIGN PATENT DOCUMENTS

DE    102008040742 A1    2/2009
EP         1262836 A1    12/2002
(Continued)

OTHER PUBLICATIONS

English translation of Taiwan Office Action dated Jul. 11, 2013 in corresponding Taiwan Patent Application No. 099133135.
(Continued)

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

In a lithographic apparatus, an illumination mode is set using a field mirror comprising a plurality of movable facets to direct radiation to selectable positions on a pupil facet mirror. In the event that a field facet mirror is defective and cannot be set to a desired position, another of the movable facet mirrors is set to a corrective position, different than its desired position, to at least partially ameliorate a deleterious effect of the defective facet mirror.

10 Claims, 4 Drawing Sheets

(56) References Cited

U.S. PATENT DOCUMENTS

| | | | |
|---|---|---|---|
| 2007/0030471 A1* | 2/2007 | Troost et al. | 355/67 |
| 2008/0165925 A1* | 7/2008 | Singer et al. | 378/34 |
| 2008/0239268 A1 | 10/2008 | Mulder et al. | |
| 2009/0033902 A1* | 2/2009 | Mulder et al. | 355/66 |
| 2009/0091731 A1 | 4/2009 | Ossmann et al. | |
| 2012/0293784 A1 | 11/2012 | Xalter et al. | |

FOREIGN PATENT DOCUMENTS

| | | |
|---|---|---|
| JP | 2003-22967 | 1/2003 |
| JP | 2005-510862 | 4/2005 |
| JP | 2008-258605 | 10/2008 |
| JP | 2009-117671 | 5/2009 |
| JP | 2010-518595 | 5/2010 |
| TW | 200900673 | 1/2009 |
| TW | 200900874 | 1/2009 |

OTHER PUBLICATIONS

International Search Report for PCT International Patent Application No. PCT/EP2010/063192, mailed Dec. 7, 2010.

* cited by examiner

LITHOGRAPHIC APPARATUS AND DEVICE MANUFACTURING METHOD WITH CORRECTIVE POSITIONING OF REFLECTIVE ELEMENT

CROSS-REFERENCE TO RELATED APPLICATIONS

This application is the United States national phase entry of PCT/EP2010/063192, filed Sep. 8, 2010, which claims the benefit of U.S. provisional application No. 61/262,225, which was filed on 18 Nov. 2009, the contents of both of which are incorporated herein in their entireties by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured. A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

It is well known in the art of lithography that an image of the patterning device projected onto a substrate can be improved by appropriately choosing angles at which the patterning device is illuminated, i.e., by appropriately choosing an angular distribution of radiation illuminating the patterning device. In a lithographic apparatus having a Koehler illumination system, the angular distribution of radiation illuminating the patterning device is determined by a spatial intensity distribution of the illumination beam in a pupil plane of the illumination system. This is because the illumination beam at the pupil plane effectively acts as a secondary or virtual radiation source for producing the illumination beam that is incident on the patterning device. The shape of the spatial intensity distribution of the illumination beam at the pupil plane within the illumination system is commonly referred to as the illumination mode or profile. The pupil plane of the illumination system may also be referred to as the pupil plane of the patterning device.

Illumination beams with certain spatial intensity distributions at the pupil plane improve the processing latitudes when an image of the patterning device is projected onto a substrate. In particular, an illumination beam having a spatial intensity distribution with a dipole, annular or quadrupole off-axis illumination mode can enhance the resolution and/or other parameters of the projection, such as sensitivity to projection system optical aberrations, exposure latitude and depth of focus. Certain "soft-pole" illumination modes may also have an advantageous effect on the image of the patterning device projected onto a substrate. Accordingly, an illumination system typically includes one or more devices or structures to direct, shape and control the illumination beam such that it has a desired spatial intensity distribution/illumination mode at the pupil plane.

SUMMARY

In a lithographic apparatus using, for example, EUV radiation as the illumination beam (and thus the patterned beam), transmissive optical elements, such as a zoom-axicon and/or diffractive optical elements, cannot be used to shape the illumination beam because there are no suitable materials transmissive to EUV radiation. An illumination system for EUV radiation comprises a field mirror which collects radiation from a source and directs it to a pupil mirror, which is associated with a pupil plane of the illumination system. It has been proposed to form the field mirror from an arrangement of individually movable facets which direct radiation onto corresponding facets of the pupil mirror in order to define a desired illumination mode. See, for example, U.S. patent application Nos. 61/157,498 and 61/236,789 which documents are hereby incorporated by reference in their entirety. In one arrangement, each movable field facet can be switched between two positions to direct radiation onto a selected one of two corresponding pupil facets. In another arrangement, each movable field facet can be switched between three positions to direct radiation onto a selected one of two corresponding pupil facets or in a direction such that it does not reach the substrate.

A movable facet mirror has a mechanical drive system and an actuator, usually a motor of some kind. Therefore it can be subject to failure. Failure may mean that the facet mirror is stuck in one of its predetermined positions or in a position between the predetermined positions. A facet mirror stuck in an intermediate position will usually direct radiation in such a direction that it does not reach the substrate and can be regarded as being stuck in an "off" state. A facet mirror stuck in the "wrong" position or an off-state means that a desired illumination profile may not be achieved, which has a negative effect on imaging quality. In particular, a defective facet mirror may cause a telecentricity error leading to imaging errors severe enough to result in defective devices.

It is desirable, for example, to provide a lithographic apparatus having a field facet mirror including movable facets that is more resilient to one or more defective facets.

According to an aspect, there is provided a lithographic apparatus arranged to project a pattern from a patterning device onto a substrate and having an illumination system configured to condition a radiation beam and direct the radiation beam onto the patterning device, wherein the illumination system comprises: a first reflective component and a second reflective component, the first reflective component being arranged to direct radiation of the radiation beam onto the second reflective component and comprising a plurality of movable reflective elements, each movable reflective element being movable between at least a first position and a second position so as to change an illumination mode, and the second reflective component being associated with a pupil plane of the illumination system; and a control system arranged to set the plurality of movable reflective elements to respective desired positions in order to effect a desired illumination mode and further arranged, in the event that a first one of the movable reflective elements is defective and cannot be set to the respective desired position, to set a second one of the movable reflective elements to a corrective position, different than its desired position, to at least partially ameliorate a deleterious effect of the first one of the movable reflective elements.

According to an aspect, there is provided a lithographic method for manufacturing a device, the method comprising: directing a radiation beam onto a first reflective component so that it is reflected thereby and incident on a second reflective component, the radiation beam being incident thereafter on a patterning device, and the first reflective component comprising a plurality of movable reflective elements, each movable reflective element being movable between at least a first position and a second position so as to change an illumination mode of the patterning device; patterning the radiation beam using the patterning device; and projecting the patterned radiation beam onto a substrate, the method further comprising: setting the movable reflective elements to desired positions to define a desired illumination mode; and in the event that a first one of the movable reflective elements is defective and cannot be set to the respective desired position, setting a second one of the movable reflective elements to a corrective position, different than its desired position, to at least partially ameliorate a deleterious effect of the defective movable reflective element.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
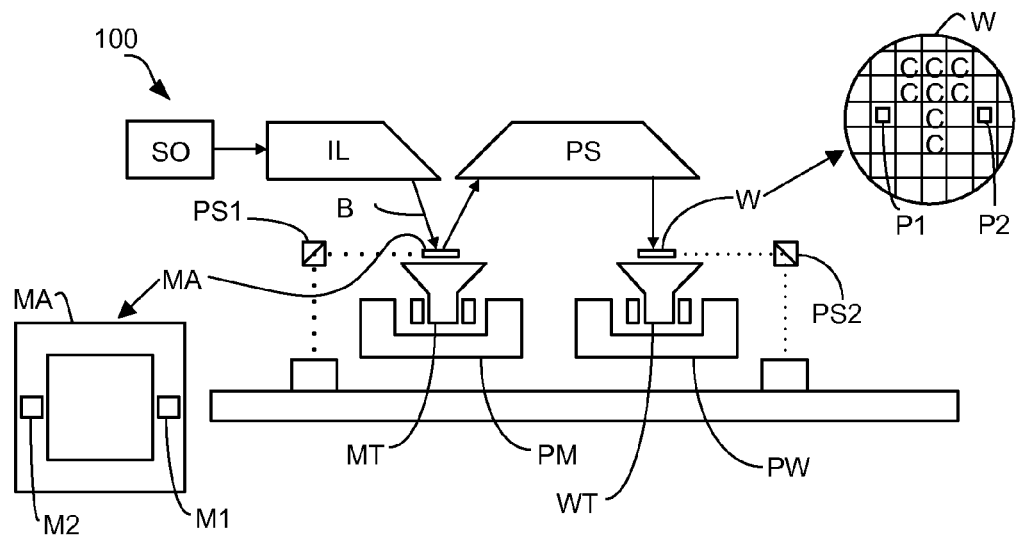
FIG. 1 depicts a lithographic apparatus according to an embodiment of the invention.

FIG. 1 schematically depicts a lithographic apparatus 100 including a source collector module SO according to one embodiment of the invention. The apparatus comprises:

an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives, in an embodiment, an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material, having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module.

The laser and the source collector module may be separate entities, for example when a $CO_2$ laser is used to provide the laser beam for fuel excitation. In such cases, the laser is not considered to form part of the source collector module and the radiation beam is passed from the laser to the source collector module with the aid of a beam delivery system comprising, for example, suitable directing mirrors and/or a beam expander. In other cases the laser may be an integral part of the source collector module, for example when the source is a discharge produced plasma EUV generator, often termed as a DPP source. In similar manner, the source collector module and the lithographic apparatus may be separate entities or the source and the lithographic apparatus may be separate entities.

The illuminator IL may comprise an adjuster configured to adjust the angular intensity distribution of the radiation beam. Desirably, at least the outer and/or inner radial extent (commonly referred to as σ-outer and σ-inner, respectively) of the intensity distribution in a pupil plane of the illuminator can be adjusted. In addition, the illuminator IL may comprise various other components, such as faceted field and pupil mirror devices. The illuminator may be used to condition the radiation beam to have a desired uniformity and intensity distribution in its cross-section.

The radiation beam B is incident on the patterning device (e.g., mask) MA, which is held on the support structure (e.g., mask table) MT, and is patterned by the patterning device. After being redirected by the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
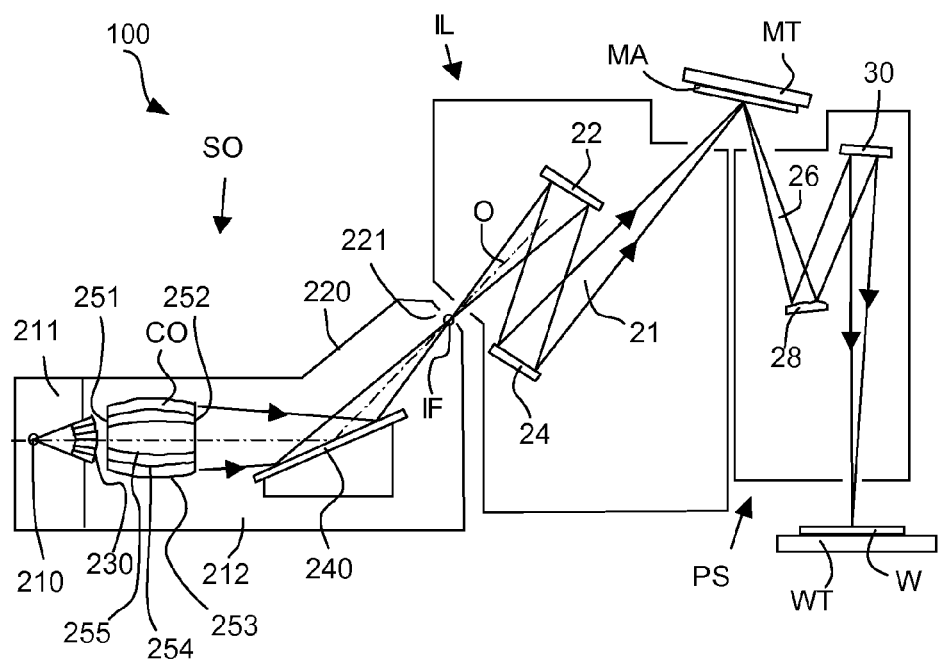
FIG. 2 is a more detailed view of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant barrier 230 (in some cases also referred to as contaminant trap or foil trap) which is positioned in or behind an opening in source chamber 211. The contaminant barrier 230 may include a channel structure. Contaminant barrier 230 may include a gas barrier or a combination of a gas barrier and a channel structure. The contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a faceted field mirror device 22 and a faceted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination system IL and projection system PS. The spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is desirably used in combination with a discharge produced plasma source, often called a DPP source.

Figure 3:
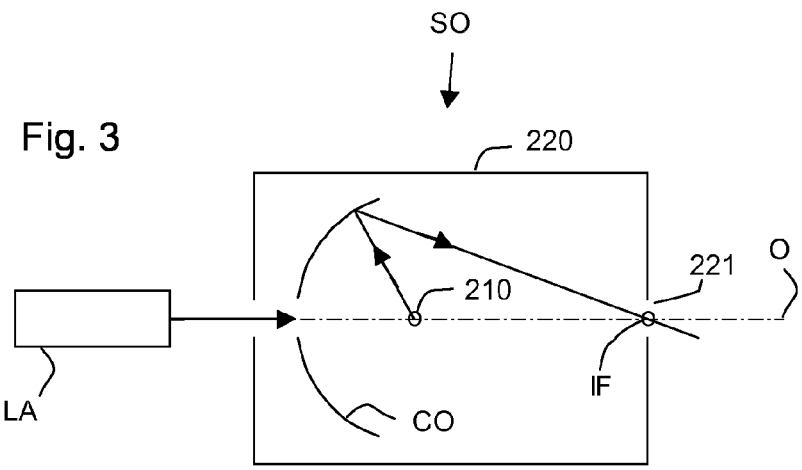
FIG. 3 is a more detailed view of the source collector module of the apparatus of FIGS. 1 and 2.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
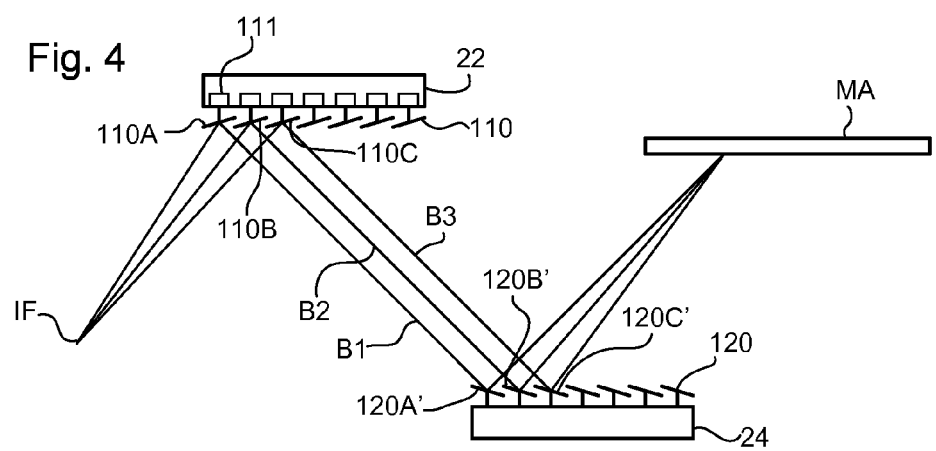
FIGS. 4 and 5 depict the illumination system of a lithographic apparatus and illustrate the functioning of movable field facet mirrors.
Figure 5:
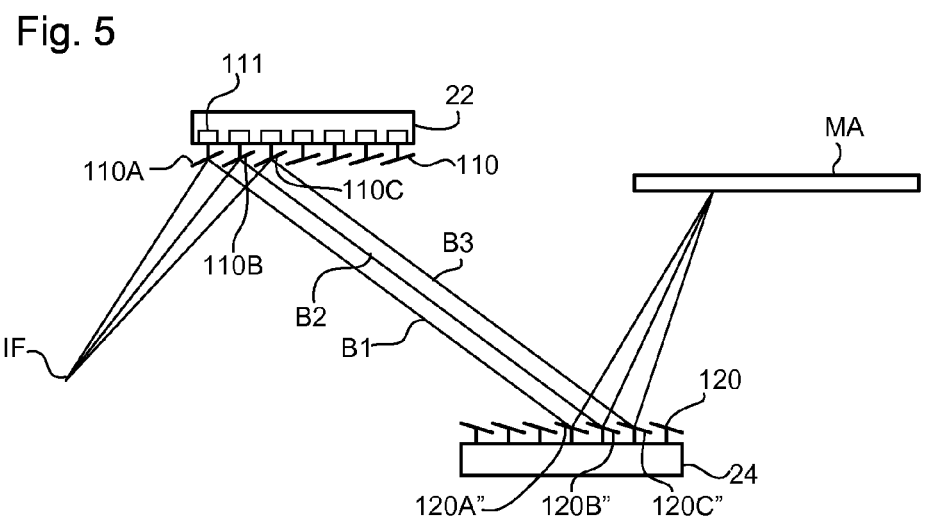

FIGS. 4 and 5 are schematic diagrams showing how the illumination beam is conditioned and directed to the patterning device using first reflective component 22 and second reflective component 24. Note that other optical components may be included in illuminator IL but are omitted from the following description for clarity.

In the embodiment, first reflective component 22 comprises a plurality of primary reflective elements commonly known as field facet mirrors 110. The second reflective component 24 comprises a plurality of secondary reflective elements commonly known as pupil facet mirrors 120. The primary reflective elements 110 are configured to direct (reflect) radiation towards the secondary reflective elements 120. The primary reflective elements of the first reflective component are configured side by side close enough together so as to leave substantially no gap in between in order to reduce or minimize any loss of radiation. The secondary reflective elements of the second reflective component are also configured so as to reduce or minimize any loss of radiation.

The second reflective component 24 is associated with the pupil plane and so the second reflective component acts as a virtual radiation source. In an embodiment, the second reflective component is located in and coincides with the pupil plane. In an embodiment, the second reflective component may be displaced a small distance from the pupil plane. The secondary reflective elements direct radiation to appropriately fill the illumination field on the patterning device MA. In an embodiment, there may be disposed, in the illuminator, a condenser mirror or system of mirrors (not shown), which images the field facet mirrors on the patterning device.

The angular distribution of radiation illuminating the patterning device is determined by the spatial intensity distribution of the radiation beam at the second reflective component. The spatial intensity distribution is determined by which of the secondary reflective elements are illuminated i.e. the illumination mode at the second reflective component. The illumination of the secondary reflective elements is in turn determined by the position of each of the primary reflective elements.

The illumination mode is controlled by selecting and then moving each of the primary reflective elements 110 to either its first position or a second position as required. When primary reflective elements 110A, 110B and 110C are orientated in their first positions, sub-beams B1, B2, B3 of radiation are reflected towards associated first secondary reflective elements 120A', 120B' and 120C'—see FIG. 4. When primary reflective elements 110A, 110B and 110C are orientated in their second positions, sub-beams B1, B2, B3 of radiation are reflected towards different second associated secondary reflective elements 120A", 120B" and 120C"—see FIG. 5.

It will be understood that secondary reflective elements 120A', 120B' and 120C' are essentially first associated locations at the second reflective component. Likewise, secondary reflective elements 120A", 120B" and 120C" are essentially second associated locations at the second reflective component.

The first position and second position of each primary reflective element are different and unique with respect to those of the other primary reflective elements. Likewise, the two secondary reflective elements associated with each primary reflective element are different and unique with respect to the secondary reflective elements associated with the other primary reflective elements. By selecting and moving each primary reflective element appropriately, radiation can be directed towards the requisite secondary reflective elements at the pupil plane so as to produce a particular desired spatial intensity distribution with a specific illumination mode. By controlling the position of each primary reflective element as required the spatial intensity distribution of the radiation beam at the pupil plane can be switched, that is changed, to other desired spatial intensity distributions having different illumination modes. For example, the sub-beams may be directed to certain locations at the pupil plane so as to produce spatial intensity distributions with, for example, an annular, a dipole, a quadrupole, etc. off-axis shaped illumination mode.

In an embodiment, the secondary reflective elements are permanently mounted such that the orientation of each of the secondary reflective elements is fixed and unchanging. To allow for the illumination of two different secondary reflective elements by each primary reflective element, the ratio of primary reflective elements to secondary reflective elements is at least 1:2. The primary reflective elements are configured to only direct radiation onto a single corresponding secondary reflective element at any one time. Moreover, an optical power of a primary reflective element is selected and configured to produce a radiation beam with a suitable size and etendue ratio so as to ensure the radiation beam reflected by the primary reflective element is small enough to illuminate only a single corresponding secondary reflective element at any one time.

Although FIGS. 4 and 5 show only a few primary reflective elements and associated secondary reflective elements, the illuminator may comprise a larger number of primary reflective elements and a larger number of secondary reflective elements.

An array of primary reflective elements may be arranged and/or an array of secondary reflective elements may be arranged in a two dimensional grid-like formation in a plane which crosses through the plane of the radiation beam. The first reflective component may comprise one or more arrays of primary reflective elements. Likewise, the second reflective component may comprise one or more corresponding arrays of secondary reflective elements. For example, a lithographic apparatus may comprise 16 arrays of primary reflective elements used in conjunction with 32 arrays of secondary reflective elements. As mentioned previously, the term "array" in this text may mean a single array or a group of arrays.

As explained above, the lithographic apparatus may produce a desired illumination mode at the pupil plane in the illuminator by selecting the requisite position of and moving each primary reflective element to its requisite position accordingly. In an embodiment, the orientation of each primary reflective element is limited to only two positions—the first position and the second position—and are not in normal operation movable to any other position (e.g. a position between the first position and the second position). Such an embodiment is referred to below as a two-position field facet mirror.

In another embodiment, each primary reflective element is movable to a third position, which may, for example, be between the first and second positions. In the third position, the radiation reflected by the primary reflective element does not reach the substrate. The third position may be regarded as an "off" position. Such an embodiment is referred to below as a three-position field facet mirror.

In an embodiment, each primary reflective element is moved between positions by rotating it about an (predetermined) axis. The locations of the first associated location (e.g. first associated secondary reflective element) and second associated location (e.g. second associated secondary reflective element) at the pupil plane are dependent on the angles of rotation to the first position and second position (associated with the first and second locations).

In an embodiment, the first position and second position of each primary reflective element (and subsequently the first and second associated locations) are chosen so as to maximize the number of useful illumination modes that can be produced.

A primary reflective element can be rotated about an axis between a first position and a second position by a driver.

One or more primary reflective elements may be configured to be driven to rotate around the same axis. One or more other primary reflective elements may be configured to be driven to rotate around other axes.

In an embodiment, each primary reflective element comprises a driver motor 111 to drive the primary reflective element. The first and second positions may be defined by mechanical end stops, so that in a two position field facet mirror, a driver signal to be applied to the driver motor can be a binary signal. It is appreciated that such a use of binary (two-valued) driver signals for driver motors mitigates the complexity of a control system to provide feedback control of the orientation of each mirror. A more complex control system is required for a three position field facet mirror but such a mirror has an advantage of enabling additional illumination modes to be defined. For example the size of the poles in a multipole illumination mode can be controlled at the cost of reduced throughput.

Figure 6:
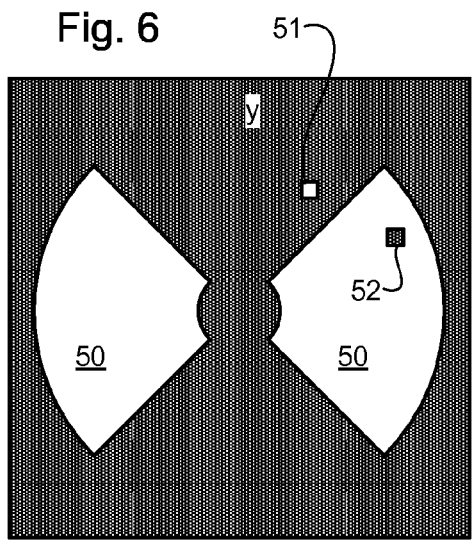
FIGS. 6 and 7 depict the effect of a corrective action in an embodiment of the invention.

FIG. 6 shows an example illumination mode generated by a two-position field facet mirror in which one of the movable field facet mirrors is defective (e.g., it is stuck in position, does not reach the desired position in time or at all, etc.). In this example, the desired illumination mode is a dipole illumination mode with poles 50 located on the X axis. The defective field facet mirror is in a position that directs radiation out of the desired poles to a location 51 that should be dark in the desired illumination mode. For example the defective field facet mirror is stuck in its first position but the desired illumination mode requires it to be in its second position. A corresponding dark hole 52 is left in one of the poles 50. The effect of this defective mirror is therefore to introduce a telecentricity error—in other words the center of intensity of the effective illumination mode is displaced from the optical axis of the illuminator.

Figure 7:
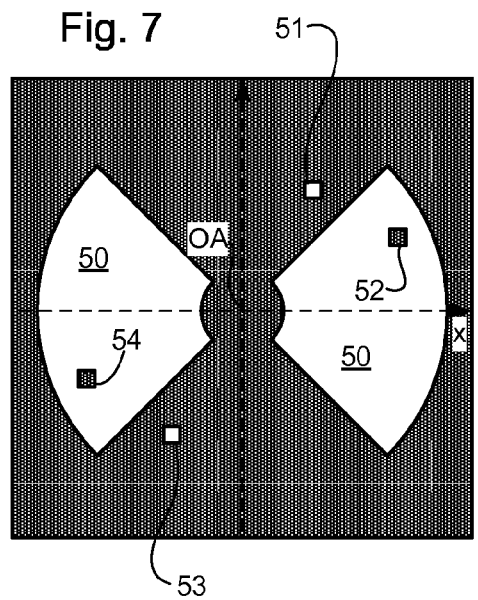

In an embodiment of the invention, corrective action is taken in response to the defective position. As shown in FIG. 7, the corrective action is to switch another field facet mirror to a corrective position, different than the position it would be put in to effect the desired illumination mode. The field facet mirror set to a corrective position directs radiation to a spot 53 in the pupil plane that is symmetrically opposite relative to the optical axis of the illumination system to the spot 51 to which radiation is directed by the defective field facet mirror. In an embodiment, spot 53 may be located opposite to spot 51 relative to an imaginary line in the pupil plane passing through the optical axis OA, e.g. one of the x or y axes. Note that in an embodiment the field facet mirror that is used to effect the correction need not be oppositely located to the defective field facet. This is because the relationship between field facets and pupil facets, known as channel assignment, need not be symmetric. A dark spot 54 is also created opposite to the dark spot 52 created by the defective field facet mirror. Although the resulting illumination mode, shown in FIG. 7, could be seen as deviating from the desired mode more than the uncompensated mode shown in FIG. 6, the effect of the corrective action taken in an embodiment of the invention is to reduce or eliminate the telecentricity error. Since the telecentricity error may lead to imaging errors severe enough to cause defective devices, it is desirable to correct this, even at the cost of some other effect on the image, e.g. a loss of contrast.

Figure 8:
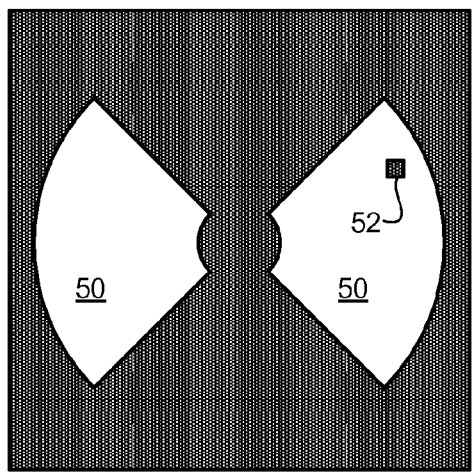
FIGS. 8 and 9 depict the effect of a corrective action in another embodiment of the invention.
Figure 9:
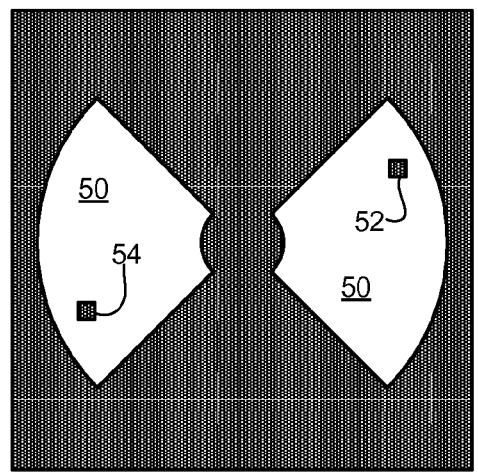

Another possible effect of a defective field facet mirror is shown in FIG. 8. Here the field facet mirror, for example a three-position field facet mirror, is stuck in an "off" position whereby the radiation reflected from it does not reach the substrate. There is in effect a dark spot 52 in the desired illumination mode which again introduces a telecentricity error. In this case, referring to FIG. 9, the corrective action is to switch a corresponding field facet mirror to its "off" position to produce a symmetrically opposite dark spot 54. This corrects the telecentricity error at the cost of only a small reduction in beam intensity at substrate level. This can easily be compensated for by an increase in exposure time.

In an embodiment, two or more field facets are moved to corrective positions in order to compensate for one defective field facet. This is desirable if the defective field facet introduces a telecentricity error that cannot be corrected using just one other field facet. Of course using two or more field facets for corrective action may create a greater divergence from the desired illumination mode but is still desirable if the overall effect is an improvement in relevant characteristics. A merit function may be used to determine the best corrective action taking into account all relevant parameters.

Accordingly, using an embodiment of the invention, one or more defective field facet mirrors can be tolerated with only mirror and acceptable reductions in performance of the apparatus, whereas without even one defective field facet mirror may lead to unacceptable imaging errors, necessitating repair or replacement of the field mirror system.

It should be noted that the existence of a defective field facet mirror does not mean that a correction is always necessary. Certain illumination modes may require the defective field facet mirror to be in the position that it is stuck, in which case no correction is necessary. It is desirable therefore to determine the need for any corrective action in respect of a defective field facet mirror with reference to the desired illumination profile.

Figure 10:
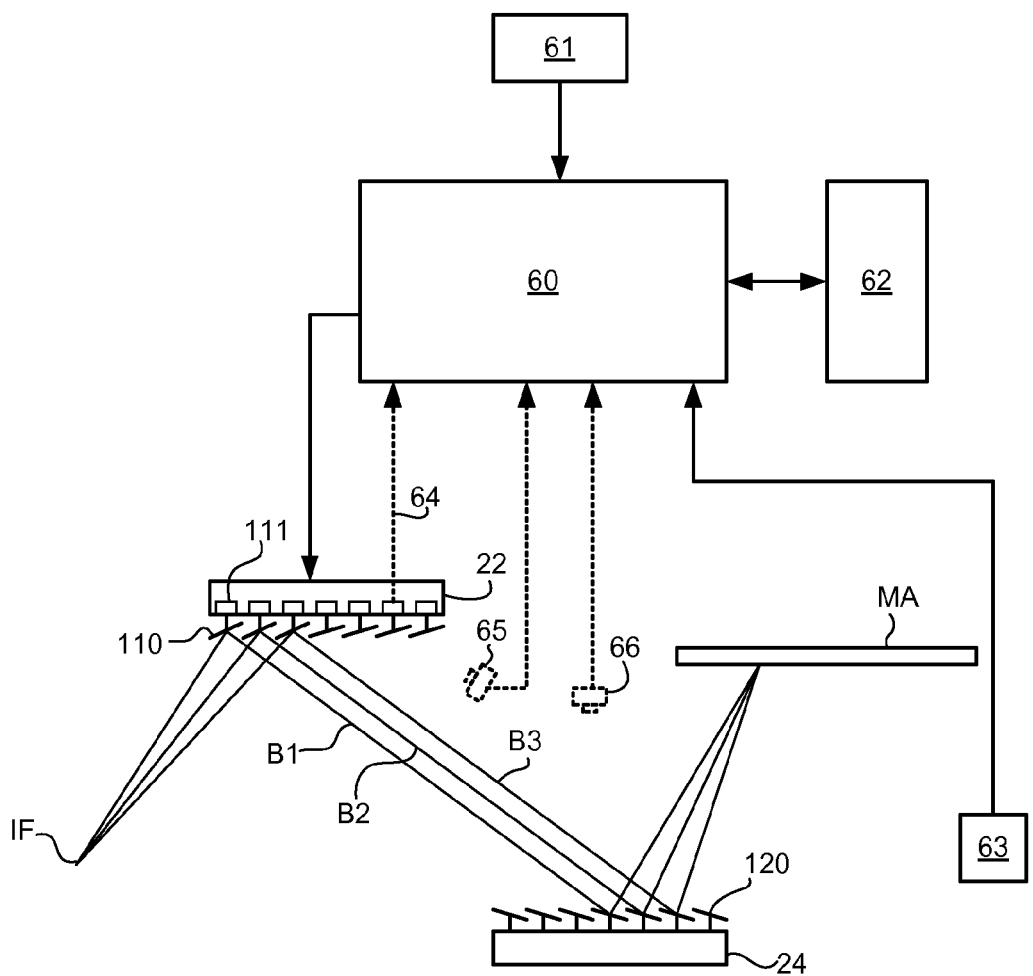
FIG. 10 depicts a control system for a field mirror including movable facets according to an embodiment of the invention.

A control system arranged to implement an embodiment of the present invention is shown in FIG. 10. Controller 60 receives information defining a desired illumination mode from interface 61. Interface 61 may be a user interface by which a user inputs the information to define the desired illumination mode or an interface to a supervisory machine control system which coordinates activities of the apparatus as a whole and/or other associated devices in a lithocell or cluster. Interface 61 may also include a memory in which the information defining the illumination mode is stored. Based on the information defining the illumination mode, the controller 60 instructs actuators 111 to set the field facet mirrors to the necessary positions to effect the desired illumination mode. In doing so, controller 60 has reference to memory 62 which stores information identifying any defective field facet mirrors and the nature of their defect, e.g. the position in which they are stuck. Controller 60 uses this information to determine whether or not any other field facet mirrors need to be set to corrective positions on the basis of the principles set out above.

The control system described above should know whether there are any defective field facet mirrors and if so which. Detection of defective field facet mirrors can be performed in several different ways. For example, a sensor 63 at substrate level can be used with a suitable aperture in place of the patterning device to directly measure the pupil as effective at substrate level, thereby identifying any defective field facet mirrors. This measurement cannot be performed during actual exposures but can be performed during periodic calibration or maintenance procedures or during substrate swap intervals.

Real-time detection of defective field facet mirrors can be performed by considering feedback signals 64 from the actuators of the movable field facet mirrors. Such feedback signals may include signals from a position sensor attached to the motors used to move the mirrors or may be derived from measuring the current flow or back-emf when the drive signals are applied to the actuators. This approach may however not reliably detect defective field facet mirrors caused by a broken connection between the actuator and the actual mirror. Another approach to detecting defective field facet mirrors is to use a camera 65 to observe the field facet mirrors but it may not be desirable to illuminate the field mirror in order to do this. A still further approach is to use an infra-red camera 66 to observe the pupil mirror 24. Since the pupil mirror is not perfectly reflective and non-uniformly illuminated, its temperature profile as detected by the infrared camera will indicate the illumination pattern and can be compared to the desired illumination mode.

Although discussion herein has been with reference to the field facet mirrors, the concepts and features herein may be equally applicable to pupil facet mirrors or non-reflective optical elements.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, certain features of the invention may be embodied as a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

The invention claimed is:

1. A lithographic apparatus arranged to project a pattern from a patterning device onto a substrate and having an illumination system configured to condition a radiation beam and direct the radiation beam onto the patterning device, wherein the illumination system comprises:
   a first reflective component and a second reflective component, the first reflective component being arranged to direct radiation of the radiation beam onto the second reflective component and comprising a plurality of movable reflective elements, each movable reflective element being movable between at least a first position and a second position so as to change an illumination mode, and the second reflective component being associated with a pupil plane of the illumination system; and
   a control system arranged to set the plurality of movable reflective elements to respective desired positions in order to effect a desired illumination mode and further arranged, in the event that a first one of the movable reflective elements is defective and cannot be set to the respective desired position, to set a second one of the movable reflective elements to a corrective position, different than its desired position, to at least partially ameliorate a deleterious effect of the first one of the movable reflective elements, wherein the control system is arranged such that the second one of the movable reflective elements is a movable reflective element that in its desired position would direct radiation to a second point in the pupil plane that is opposite to a first point in the pupil plane to which radiation would have been directed by the first one of the movable reflective elements, and wherein the second point is opposite to the first point relative to an optical axis of the illumination system or relative to an imaginary line lying in the pupil plane and passing through the optical axis of the illumination system.

2. The lithographic apparatus according to claim 1, wherein the control system is arranged such that, in the event that the first one of the movable reflective elements directs radiation to a first point in the pupil plane, the second one of the movable reflective elements is set to a corrective position such that it directs radiation to a second point in the pupil plane that is opposite to the first point.

3. The lithographic apparatus according to claim 1, wherein the control system is arranged to, in the event that the first one of the movable reflective elements directs radiation so as to cause a first telecentricity error, set the second one of the movable reflective elements to a corrective position to direct radiation so as to cause a second telecentricity error that opposes the first telecentricity error.

4. The lithographic apparatus according to claim 1, wherein the control system is arranged to, in the event that the first one of the movable reflective elements directs radiation in a direction such that it does not reach the substrate, set the second one of the movable reflective elements to a corrective position such that it directs radiation such that it does not reach the substrate.

5. The lithographic apparatus according to claim 1, wherein the control system further comprises:
   a memory configured to store information identifying a defective movable reflective element and a defective position of the defective movable reflective element; and
   a comparator configured to compare the defective position of the defective movable reflective element to the desired position of the defective reflective element, and wherein the control system is arranged to set the second one of the movable reflective elements to a corrective position only if the defective position does not equal the desired position of the defective movable reflective element.

6. A lithographic method for manufacturing a device, the method comprising:
   directing a radiation beam onto a first reflective component so that it is reflected thereby and incident on a second reflective component, the radiation beam being incident thereafter on a patterning device, and the first reflective component comprising a plurality of movable reflective elements, each movable reflective element being movable between at least a first position and a second position so as to change an illumination mode of the patterning device;
   in the event that a first one of the movable reflective elements is defective and cannot be set to a desired position to define a desired illumination mode, setting a second one of the movable reflective elements to a corrective position, different than its desired position to define a desired illumination mode, to at least partially ameliorate a deleterious effect of the defective one of the movable reflective elements, wherein the second movable reflective element in its desired position would direct radiation to a second point on the second reflective component opposite to a first point on the second reflective component to which radiation would have been directed by the first movable reflective element, and wherein the second point is opposite to the first point relative to an optical axis of an illumination system of which the first and second reflective components form a part or relative to an imaginary line lying on the second reflective component and passing through the center thereof;
   patterning the radiation beam using the patterning device; and
   projecting the patterned radiation beam onto a substrate.

7. The lithographic method according to claim 6, wherein when the first movable reflective element directs radiation to a first point on the second reflective component, the second movable reflective element is set to a corrective position such that it directs radiation to a second point on the second reflective component that is opposite to the first point.

8. The lithographic method according to claim 6, wherein when the first movable reflective element directs radiation so as to cause a first telecentricity error, the second movable reflective element is set to a corrective position to direct radiation so as to cause a second telecentricity error that opposes the first telecentricity error.

9. The lithographic method according to claim 6, wherein when the first movable reflective element directs radiation in a direction such that it does not reach the substrate, the second movable reflective element is set to a corrective position such that it directs radiation such that it does not reach the substrate.

10. The lithographic method according to claim 6, further comprising:
   storing information identifying a defective movable reflective element and a defective position of the defective movable reflective element;
   comparing the defective position of the defective movable reflective element to the desired position of the defective reflective element; and
   setting the second movable reflective element to a corrective position only if the defective position does not equal the desired position of the defective movable reflective element.

* * * * *